(12) United States Patent
Weiss

(10) Patent No.: US 7,349,105 B2
(45) Date of Patent: Mar. 25, 2008

(54) METHOD AND APPARATUS FOR MEASURING ALIGNMENT OF LAYERS IN PHOTOLITHOGRAPHIC PROCESSES

(75) Inventor: Martin Weiss, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 450 days.

(21) Appl. No.: 10/932,657

(22) Filed: Sep. 1, 2004

(65) Prior Publication Data

US 2006/0044568 A1    Mar. 2, 2006

(51) Int. Cl.
*G01B 11/14*    (2006.01)
*G01B 11/02*    (2006.01)
(52) U.S. Cl. .................. 356/620; 356/401; 356/508
(58) Field of Classification Search .............. None
See application file for complete search history.

(56) References Cited

U.S. PATENT DOCUMENTS

| | | | | |
|---|---|---|---|---|
| 5,216,257 | A * | 6/1993 | Brueck et al. | 250/548 |
| 5,414,514 | A * | 5/1995 | Smith et al. | 356/509 |
| 5,808,742 | A * | 9/1998 | Everett et al. | 356/509 |
| 6,061,606 | A * | 5/2000 | Ross | 700/121 |
| 2002/0080364 | A1 * | 6/2002 | Monshouwer et al. | 356/508 |

OTHER PUBLICATIONS

Adel, Mike, et al. "Optimized Overlay Metrology Marks: Theory and Experiment", IEEE Transactions on Semiconductor Manufacturing, vol. 17, No. 2, May 2004. pp. 166-179.

Amidror, Isaac, "The Fourier-spectrum of Circular Sine and Cosine Gratings With Arbitrary Radial Phases", Apr. 1, 1998, Optics Communications 149 (1998), Elsevier Science B.V. pp. 127-134.

Glassner, Andrew, "Andrew Glassner's Notebook: Inside Moire Patterns", IEEE Computer Graphics and Applications, Nov./Dec. 1997, pp. 97-101.

Huang, Hsu-Ting, et al., "Scatterometry—Based Overlay Metrology", Metrology, Inspection, and Process Control for Microlithography Xvii, Proceedings of SPIE, vol. 5038 (2003). pp. 126-137.

Kanjilal, A.K., et al., "Automatic Mask Alignment Without A Microscope", IMTC '94, May 10-12, Hamamatsu, THAM 1-9. pp. 849-852.

Liu, Jing-Nan, et al., "Precision Alignment of Pulse Stage Using Moire Signals", SICE Aug. 5-7, 2002, Osaka SICE02-0583 MA16-5. pp. 382-385.

Liou, N.-S., et al., "Fourier Transform Moire Strain Analysis By Using Cross Gratings Produced From Iron-on Paper and Inkjet Printer", Science Direct, Polymer Testing 22 (2003) 487-490. 2003 Published by Elsevier Science Ltd. pp. 487-490.

(Continued)

*Primary Examiner*—Layla G. Lauchman
*Assistant Examiner*—Jonathan Skovholt
(74) *Attorney, Agent, or Firm*—Blakely, Sokoloff, Taylor & Zafman LLP

(57) ABSTRACT

According to a first embodiment of the invention, a first and second reticle are used to form layers using a photolithographic process. The first and second reticles each include a grating positioned so that when the reticles are printed, the two gratings will at least partially overlap each other. The two gratings produce an interference pattern, which is used to measure overlay error.

18 Claims, 10 Drawing Sheets

OTHER PUBLICATIONS

Nishihara, H. Keith, et al., "Measuring Photolithographic Overlay Accuracy and Critical Dimensions by Correlating Binarized Laplacian of Gaussian Convolutions", IEEE Transactions on Pattern Analysis and Machine Intelligence, vol. 10, No. 1, Jan. 1988. pp. 17-30.

Patorski, K., et al., "Optical Alignment Using Fourier Imaging Phenomenon and Moire Technique", Optics and Laser Technology, Apr. 1975. pp. 81-85.

Wang, Boxiong, et al., "Moire Deflectometry Based On Fourier—Transform Analysis", Elsevier Science Ltd. 1999. Measurement 25 (1999) pp. 249-253.

Wang, Ming, "Fourier Transform Moire Tomography For High—Sensitivity Mapping Asymmetric 3—D Temperature Field", 2002 Elsevier Science Ltd., Optics & Laser Technology 34 (2002) pp. 679-685.

* cited by examiner

Grating pattern on reticle #1: 802

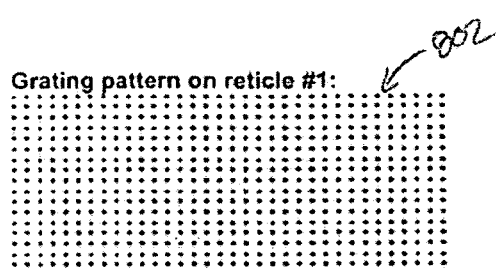

FIG. 8A

Grating pattern on reticle #2: 804

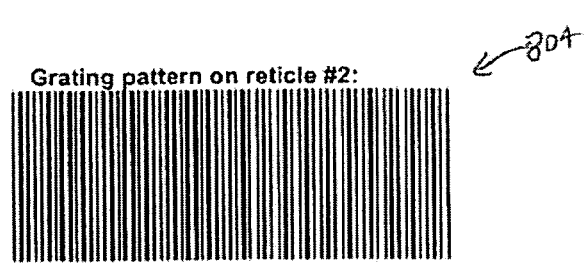

FIG. 8B

Fringe pattern resulting from superimposing grating #1 on top of grating #2:

Gratings are
perfectly aligned -
no overlay error

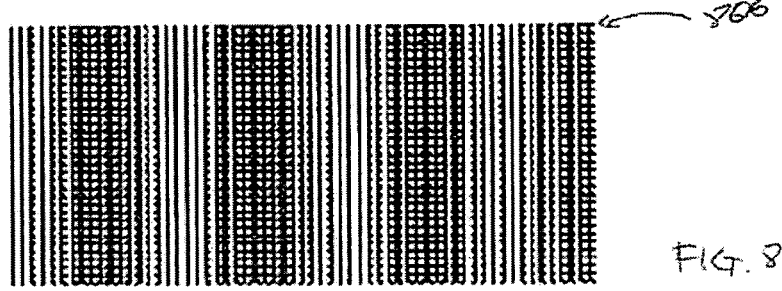

Gratings are
mis-aligned by
2 pixels – results
in a shift in the
interference fringes

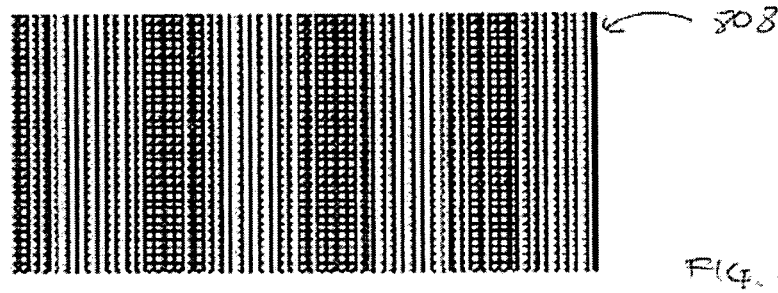

Figure 6. Moire technique applied to the case of a line / space layer aligning to a contact layer. This example would be applicable to measuring metal-to-contact/via overlay (and vice-versa). In this case, an array of design-rule-sized metal line / spaces overlaid onto an array of design-rule-sized contacts produces a Moire fringe pattern. This is similar to the example shown in figure 4, with the exception that the fringe contrast is reduced. Extraction of overlay error from the fringe pattern is performed in exactly the same manner as described in figure 5. Conventional box-in-box overlay targets for measuring metal-contact/via alignment use continuous trenches to form the via portion of the metrology target. The embodiment of the Moire overlay target shown here allows measurement of metal-to-contact/via overlay using design rule compatible contact/via arrays.

METHOD AND APPARATUS FOR MEASURING ALIGNMENT OF LAYERS IN PHOTOLITHOGRAPHIC PROCESSES

FIELD OF THE INVENTION

The invention generally relates to semiconductor processing, and specifically to techniques for measuring alignment of different layers produced during a photolithographic process.

BACKGROUND

Integrated circuits (ICs) are becoming smaller and more powerful. As ICs become smaller, the location and alignment of features on the ICs becomes more critical. Features, such as transistors and diodes, are created on semiconductor substrates using a process known as photolithography. Photolithography uses optics to define the features on the substrate. A feature may be drawn on a reticle, or mask, and light is shown through the mask so as to project the feature onto a layer of photoresist on the substrate. Photoresist is a light sensitive film that either becomes soluble or insoluble when exposed to light. After the layer of photoresist has been exposed to light, the soluble portion can be removed, typically by immersion in a developer solution. Other processing techniques, such as etching or annealing, may be performed to the underlying substrate that has been exposed as a result of the photolithography.

To form complex features in an IC, several layers of processing need to be completed. For example, to form a metal oxide semiconductor (MOS) transistor, a source and drain may be formed in the substrate using ion implantation. In another region of the substrate, a gate may be formed by depositing films over the entire substrate and removing the unwanted portions of the film. The gate may comprise portions of several film layers.

One reticle or mask may be used to pattern each layer. When more than one reticle is used, the reticles must be aligned properly so that each layer is aligned within a window of tolerance relative to the substrate and the other layers. For example, if the source and drain are created during one process, and the gate during another, and the gate overlies the source, the device will be non-functional. Therefore, proper alignment of the various layers used to construct the device is critical. Typical semiconductor devices now being made require alignments within a tolerance of a few tens of nanometers (nm).

FIG. 1 illustrates typical alignment marks used on conventional reticles. The alignment marks 100 are printed on an edge of the printed field during photolithography. A printed field is a portion of a substrate that typically generates one or more ICs. The alignment marks comprise two boxes 102 and 104, each comprising several bars 102a-d and 104a-d. Each of the bars 102a-d and 104a-d is typically one to two microns wide.

"Overlay" is a term referring to the alignment error between the layers as show in FIG. 1. If the two reticle prints were perfectly aligned, the overlay would be zero, and the centers of the boxes 102 and 104 would overlap perfectly. As shown in FIG. 1, the boxes 102 and 104 are not perfectly aligned and therefore have a non-zero overlay. The overlay is typically measured in two dimensions. The overlay along the x-axis can be determined by measuring the distance between two lines 106 and 108. The line 106 represents the centerline (i.e. average position) of bars 104c and 104d along the x-axis and the line 108 represents the centerline of bars 102c and 102d along the x-axis. Likewise, for the y-axis, the lines 110 and 112 represent the centerlines of bars 104a and 104b, and 102a and 102b, along the y-axis.

The alignment marks 100 are typically inspected using a microscope. The microscope includes a charge coupled device (CCD) to record the image of the alignment marks 100. Conventional CCDs may include an array of pixels that are typically 80-100 nanometers wide. Typical overlay errors that would affect some of these semiconductor processes are on the order of a few tens of nanometers. Due to the fact that the CCD pixel size is much larger than the desired level of accuracy, sub-pixel interpolation is required. Ultimately, the accuracy of this technique is limited by the fact that only a relatively small number of pixels are used to detect the overlay error. This, in combination with quantization effects arising from the large pixel size relative to the overlay error, may introduce errors in the overlay measurement. The impact of measurement error becomes more significant when the size of the pertinent features becomes smaller.

BRIEF DESCRIPTION OF THE DRAWINGS

One or more embodiments of the present invention are illustrated by way of example and not limitation in the figures of the accompanying drawings, in which like references indicate similar elements and in which:

FIGS. 8A, B, C, and D illustrate an alternative embodiment of the invention using alternative gratings.

DETAILED DESCRIPTION

Described herein is a Method and Apparatus for Measuring Alignment of Layers in Photolithographic Processes. Note that in this description, references to "one embodiment" or "an embodiment" mean that the feature being referred to is included in at least one embodiment of the present invention. Further, separate references to "one embodiment" or "an embodiment" in this description do not necessarily refer to the same embodiment; however, such embodiments are also not mutually exclusive unless so stated, and except as will be readily apparent to those skilled in the art from the description. For example, a feature, structure, act, etc. described in one embodiment may also be included in other embodiments. Thus, the present invention can include a variety of combinations and/or integrations of the embodiments described herein.

According to an embodiment of the invention, a first reticle including a first grating, and a second reticle including a second grating are used to form two layers of an integrated circuit (IC) or other semiconductor device. The first grating and the second grating are positioned so that when both reticles have been exposed to light during the photolithographic process, an interference pattern is produced on the substrate. The interference pattern may be a Moiré interference pattern. Adjacent to the interference pattern, a reference mark is printed on the substrate. The reference mark can be used to measure a shift in the peaks of the interference pattern. The interference pattern shifts by an amount dependent on the degree of mis-alignment between the reticles (i.e. the overlay) and pitch of the gratings. The shift in the interference pattern is equal to the overlay multiplied by an amplification factor, which makes measurement of small overlay easier. The amplification factor, as well as the periodicity of the interference pattern is dependent on the pitch and duty cycle of the gratings. Due to the amplification, an overlay error may be amplified by ten times or more, making the error easier to detect and measure. As a result, the detection of overlay is more accurate and less reliant on interpolation and quantization.

Figure 1:
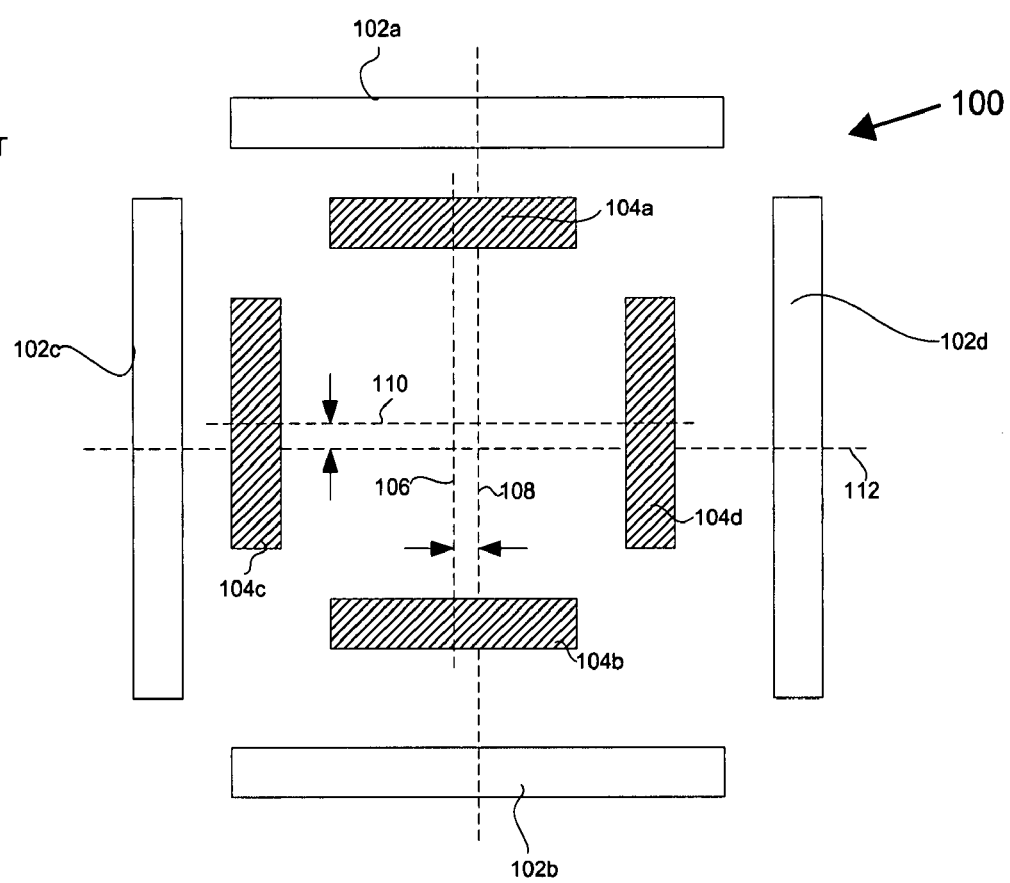
FIG. 1 illustrates typical alignment marks used on conventional reticles.
Figure 2A:
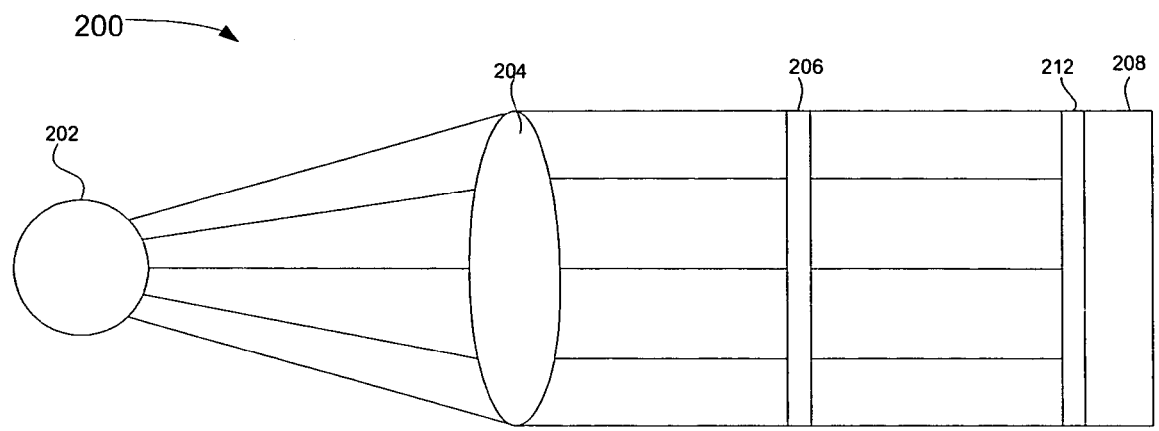
FIG. 2A illustrates an apparatus for printing semiconductor features on a semiconductor substrate.

FIG. 2A illustrates an apparatus for printing semiconductor features on a semiconductor substrate. The apparatus 200 includes a light source 202, optics 204, a reticle 206, and a substrate 208. The light source 202 may be any appropriate light source, such as an excimer laser or Mercury arc lamp. The optics 204 may include several lenses and or mirrors, and may focus or collimate the light through the reticle 206.

Figure 2B:
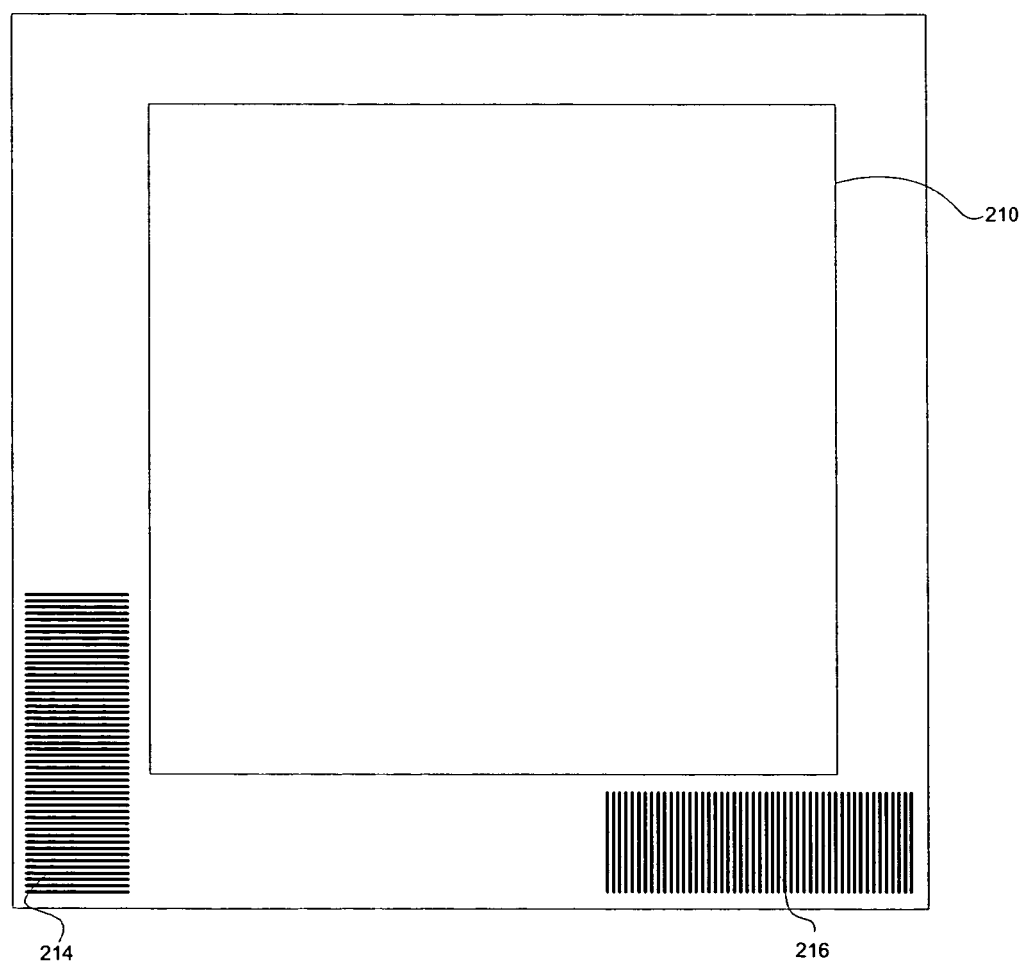
FIG. 2B illustrates an overhead view of a reticle.

FIG. 2B illustrates an overhead view of the reticle 206. The reticle 206 includes an active field 210. The active field 210 defines the features on the substrate 208. When light is projected through the active field 210, part of the light is masked off, exposing only the desired portions of a layer of photoresist 212 to the light. Depending on the type of photoresist 212 used, the exposed portions may then be removed. The now-exposed portions of the substrate 208 can then be process using other techniques, such as ion implantation, annealing, etching, etc. For example, the photoresist 212 may be deposited over a layer of silicon dioxide. If the process requires that only a portion of the layer of silicon dioxide is retained, the mask can expose the photoresist 212 such that the photoresist 212 remains only where the silicon dioxide should remain. The exposed silicon dioxide can then be etched and removed.

According to an embodiment of the invention, the reticle 206 includes two other patterns that are gratings 214 and 216. The gratings are positioned so that alignment can be measured in both the x- and y-axes. According to an embodiment of the invention, gratings such as the gratings 214 and 216 may be positioned at each corner (in the scribeline) as well as in the center of the reticle 206. However, only the two gratings 214 and 216 are shown for clarity. The gratings 214 and 216 are located outside of the active field 210 and may have a reference mark located adjacent so that overlay can be measured.

When the reticle 206 is printed, the gratings 214 and 216 are printed onto the substrate 208. When another reticle is printed, complementary grating patterns are printed so that they at least partially overlap the previously printed grating patterns. This produces an interference pattern on the substrate 208. As will be explained below, the interference pattern can be used to measure the overlay. Since the gratings 214 and 216 are printed using the same light that prints the active field 210, the interference pattern reflects any misalignment of the features printed in the active field 210.

Figure 3A:
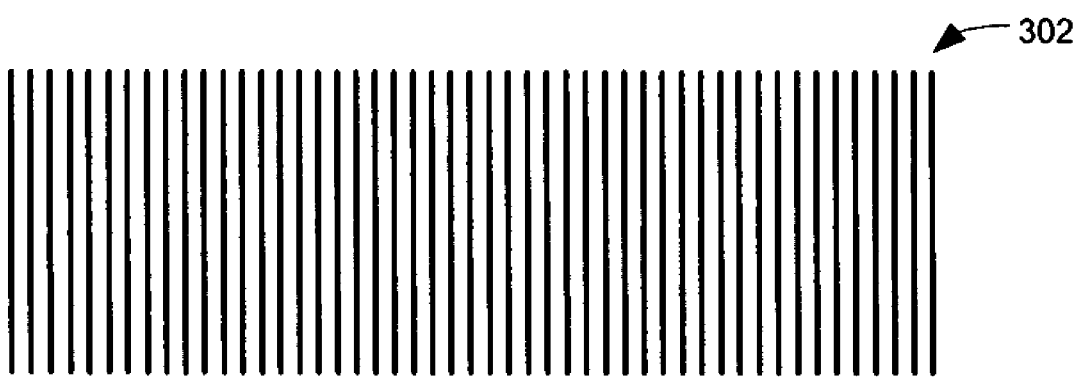
FIGS. 3A, B, C, D, and E illustrate gratings and an interference pattern.
Figure 3B:
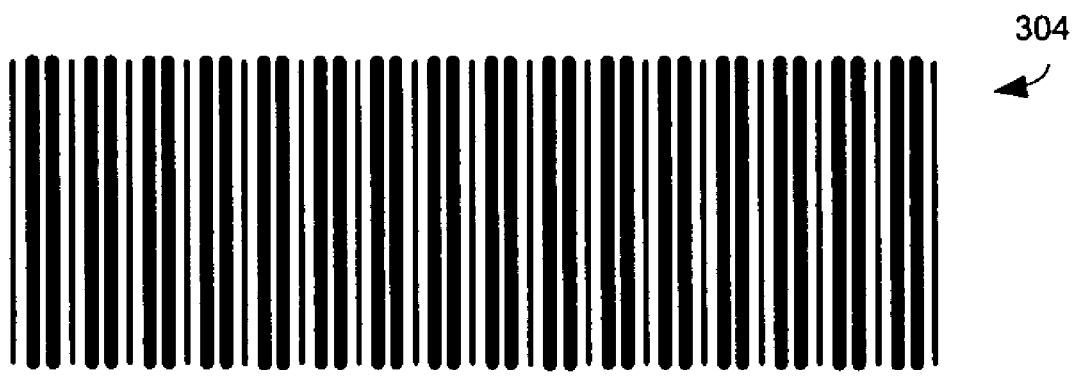
Figure 3C:
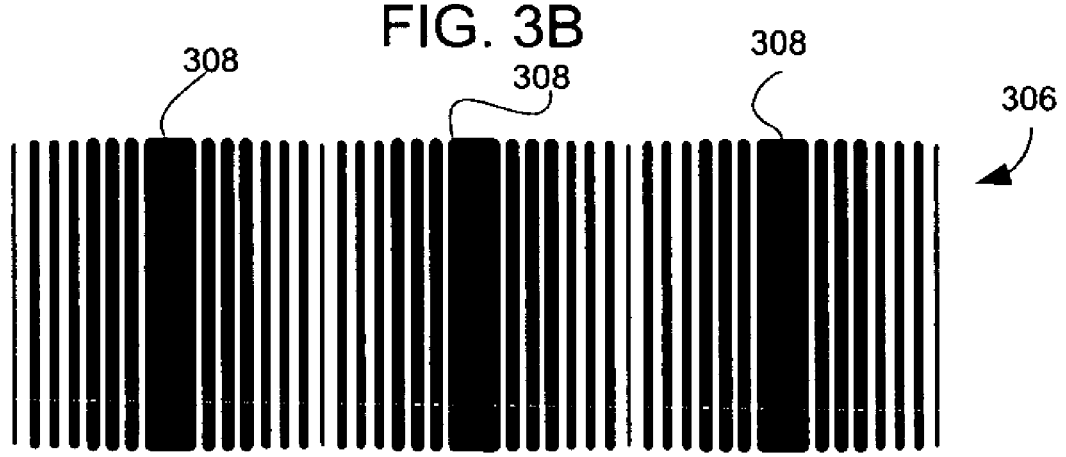

FIGS. 3A, B, C, D, and E illustrate gratings and an interference pattern. FIG. 3A illustrates a first grating 302 on a first reticle. The first reticle is used to define a first layer of features on the substrate 208. FIG. 3B illustrates a grating 304 on a second reticle. The second reticle is used to define a second layer of features over the first layer. The first grating 302 in the first reticle is positioned and patterned so that it partially overlaps with the grating 304 in the second reticle when the reticles are printed. According to one embodiment, the two gratings 302 and 304 have each have different pitches such that when they are printed in the same area of the substrate 208, they will interfere, producing a Moire interference pattern. The interference pattern can be used to determine the alignment of the two layers formed using the reticles.

The first grating 302 includes several openings. The pitch of the grating 302 is defined as the width of one area of light and one area of dark. In other words, the pitch of the gratings is the distance from a front edge of one opening to a front edge of the next opening. Typical pitches may be in the 100-500 nanometer (nm) range. The duty cycle of the grating is defined as the amount of light area compared to the amount of dark area in the pitch. For example, a fifty percent duty cycle would have equal areas of dark and light.

Figure 3D:
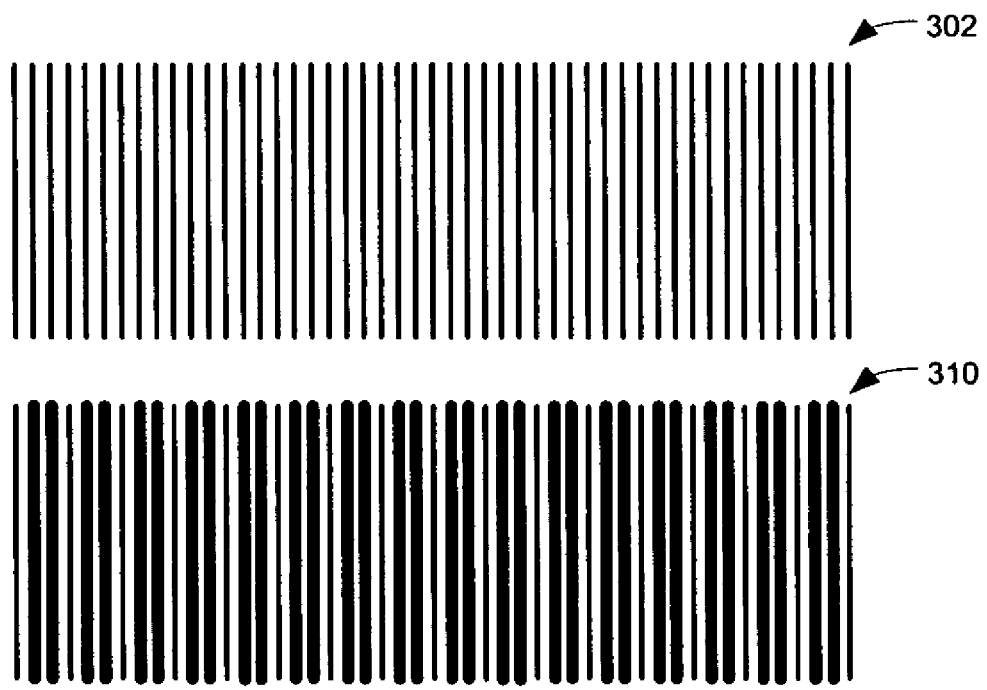
Figure 3E:
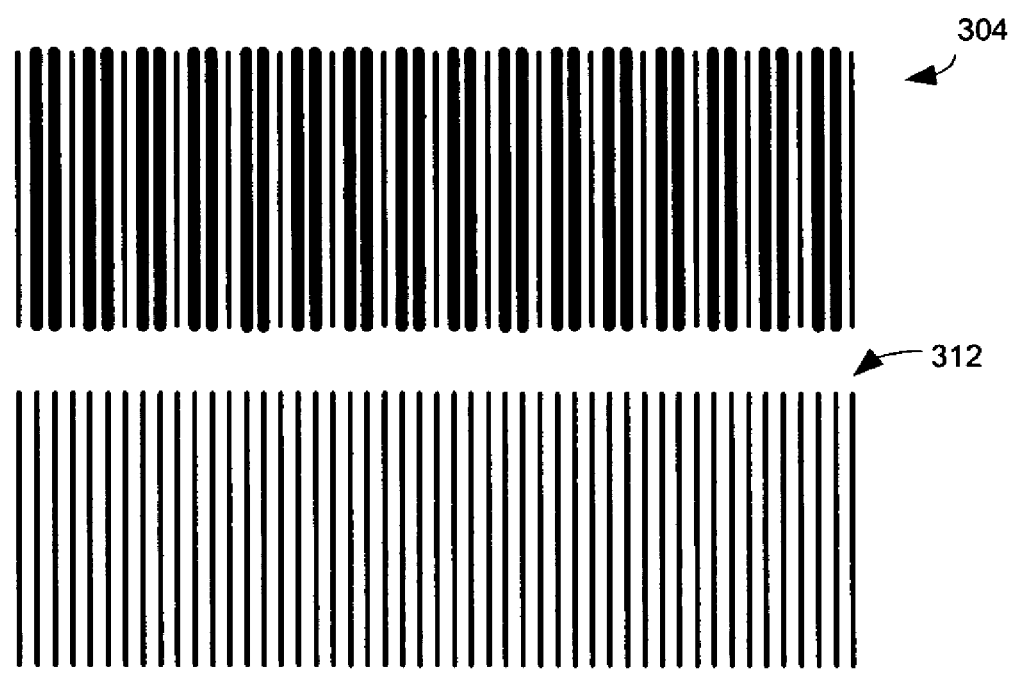

FIGS. 3D and 3E illustrate two sets of gratings to produce a first interference pattern and a second interference pattern. The second interference pattern is used to measure a shift in the first interference pattern. FIG. 3D illustrates the gratings in the first reticle, and FIG. 3E illustrates the gratings in the second reticle. The first grating 302 and a second grating 304 are used to produce the first interference pattern, and the third grating 310 and a fourth grating 312 are used to produce the second interference pattern. As will be explained below, according to one embodiment, the pitches of the gratings 302, 304, 310, and 312 are chosen so that one interference pattern has a negative amplification and the other interference pattern has a positive amplification.

Figure 4A:
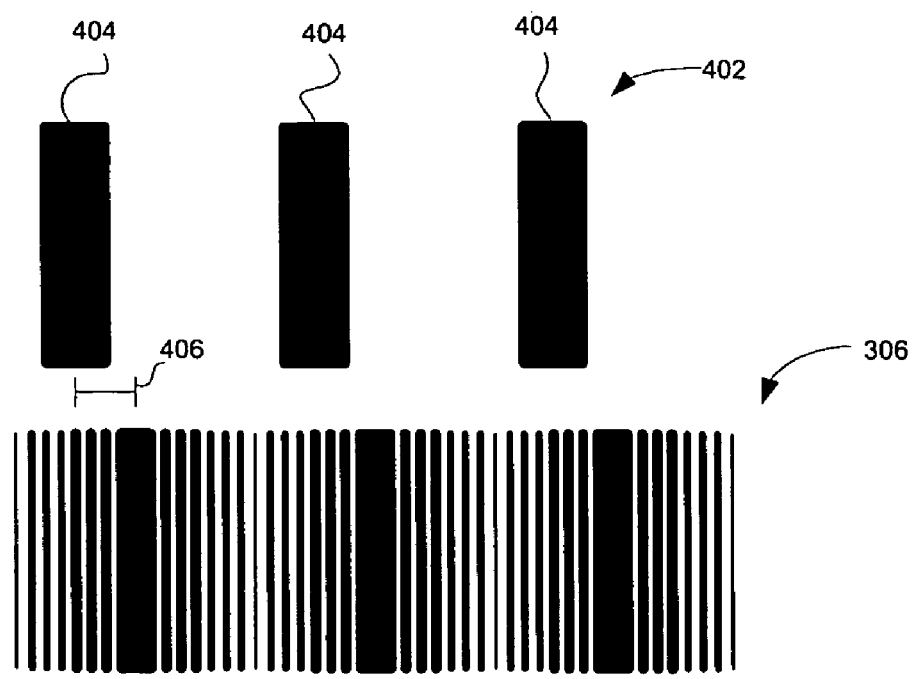
FIGS. 4A, B, and C illustrate using reference marks to determine the shift in the center of the interference pattern.

The interference pattern 306 is periodic. The peaks of the interference pattern 308 can be used to determine the shift in the interference pattern or the overlay for the two reticles. FIGS. 4A, B, and C illustrate using reference marks to determine the shift in the center of the interference pattern.

FIG. 4A illustrates a fixed reference mark 402. The fixed reference mark is printed on one of the two reticles. The peaks 308 of the interference pattern 306 are measured relative to the hash marks 404 of the reference mark 402. The shift in the peaks 308 of the interference pattern is an amplification of the actual overlay. The measured difference 406 between the peaks 308 and the reference marks 304 are a measurement of the amplified overlay. The amplification of the interference pattern 306 is given by the following equation:

$$A = \frac{g_1}{g_2 - g_1} \quad (1)$$

where $g_1$ is the pitch of the first grating 302 in the first reticle, and $g_2$ is the pitch of the second grating 304 in the second reticle. The actual overlay can be determined from the observed shift in the interference pattern 406 using the following equation:

$$\Delta X = \Delta x * A \quad (2)$$

where $\Delta X$ is the observed shift 406, and $\Delta x$ is the actual overlay.

Figure 4B:
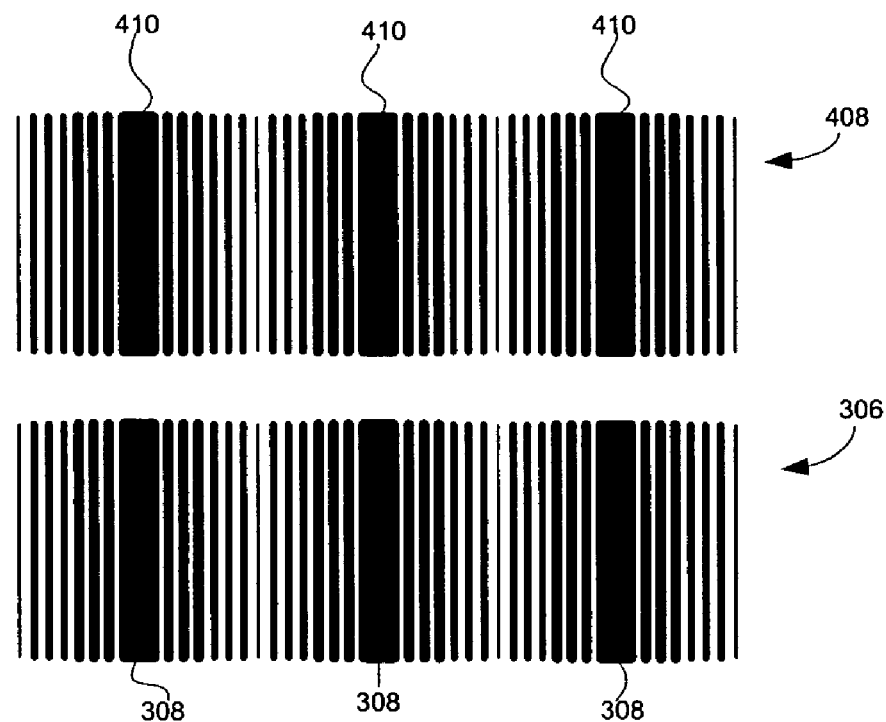
Figure 4C:
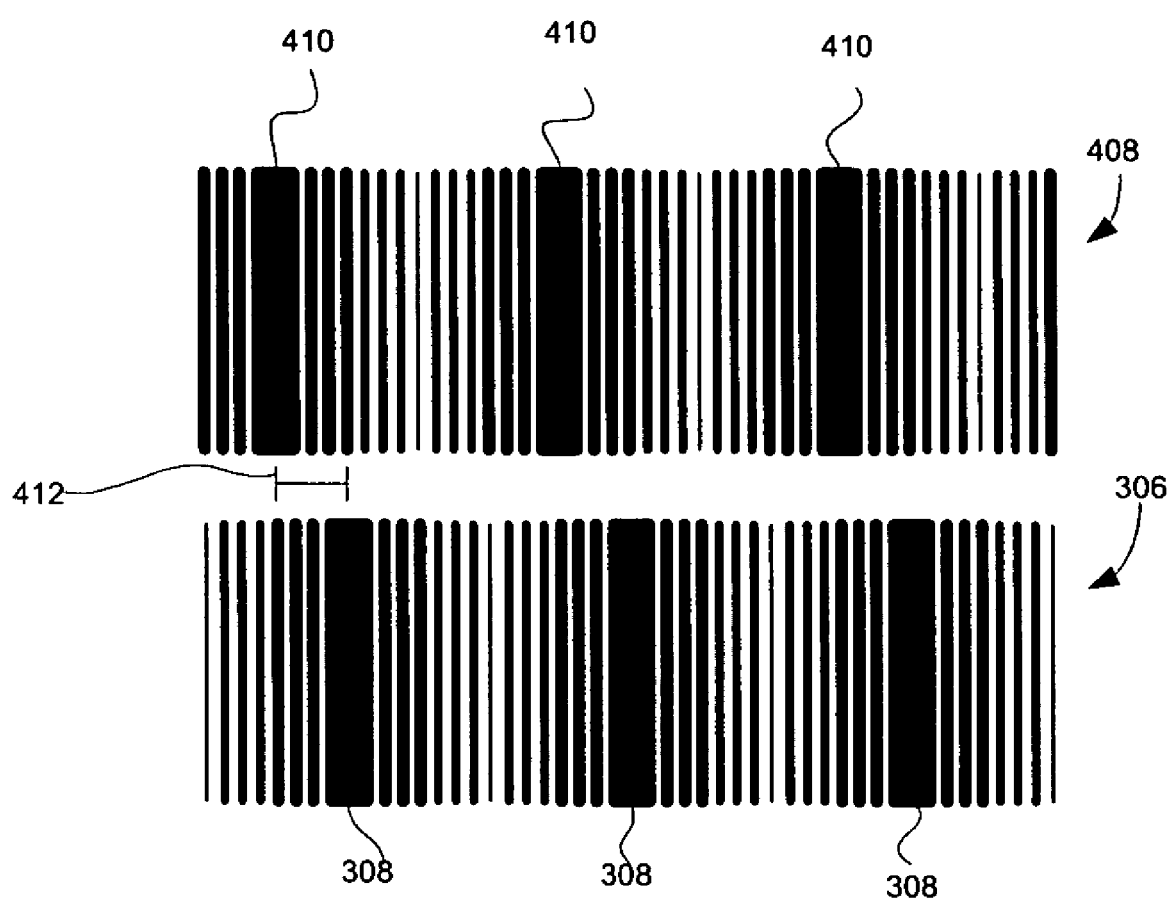

FIGS. 4B and 4C illustrate using a second reference interference pattern 408 as a reference mark rather than a fixed reference mark. According to a second embodiment of the invention, a second interference pattern 408 may be printed adjacent to the first interference pattern 306 and be used as a reference mark. For example, as explained above, the first reference pattern 306 may be generated using the gratings 302 and 304, and the second interference pattern may be generated using the gratings 310 and 312. The grating pitches may be chosen such that one pair of gratings has a positive amplification, while the other pair has a negative amplification. With this configuration, the resulting adjacent interference patterns will move away from each other (e.g., as in FIGS. 4B-C, one fringe pattern moves in the positive direction while the other moves in the negative direction).

In this structure, the total amplification of the overlay determined by measuring the position of one interference pattern 306 relative to the other 408 is the difference of the amplifications of the two grating pairs, as shown in Equation (3):

$$A_{total} = \left(\frac{g_1}{g_2 - g_1}\right) - \left(\frac{g_3}{g_4 - g_3}\right) \quad (3)$$

where $g_3$ is the pitch of the first reference grating 310, adjacent to the first grating 302 and $g_4$ is the pitch of the second reference grating 312 adjacent to the second grating. For this structure, the observed shift between the fringes of the two interference patterns 412 is given by Equation (4):

$$\Delta X = \Delta x * A_{total} \quad (4)$$

According to one embodiment, the four pitches for the four gratings may be chosen such that the amplification of one interference pattern is positive and the amplification of the other interference pattern is negative. For example, if the amplification of the first interference pattern 306 is five times, and the amplification of the second interference pattern 406 is negative five times, then the amplification of the overall structure would be 10 times. The values of the various gratings are chosen to produce this result. In this example, an observed shift in the interference pattern of ten nanometers would correspond to an actual overlay error of 1 nanometer, since the amplification is five times for each of the interference patterns 306 and 406. The observed overlay can be measured between the peaks 308 of the interference pattern 306 and the peaks 410 of the reference interference pattern 408.

In FIG. 4B the overlay is zero, since the peaks 308 and 410 are perfectly aligned. In FIG. 4C, there is some overlay error. This observed overlay can be measured. For example, the distance 412 between the peaks 308 of the first interference pattern 306 and the peaks 410 of the second interference pattern 408 may be 40 nanometers. If the amplification A of the interference pattern 306 is positive five times, and the amplification of the interference pattern 408 is negative five times, then the total amplification, $A_{total}$, would be ten times. Using equation (2), it can be determined that the overlay is four nanometers. The advantage of using the second interference pattern 408 is that that it significantly increases the amplification over using the reference mark 404.

An advantage of embodiments of the current invention is that the interference pattern 306 is imaged onto a relatively large fraction of the pixels forming the CCD array. As such, a large portion of the CCD array is used to extract the overlay information. In contrast, in conventional techniques overlay information is contained only in feature edges, which in turn are captured by a relatively small number of pixels on the CCD array. Thus, in the conventional method, most of the pixels in the CCD array provide no useful overlay information.

Figure 5:
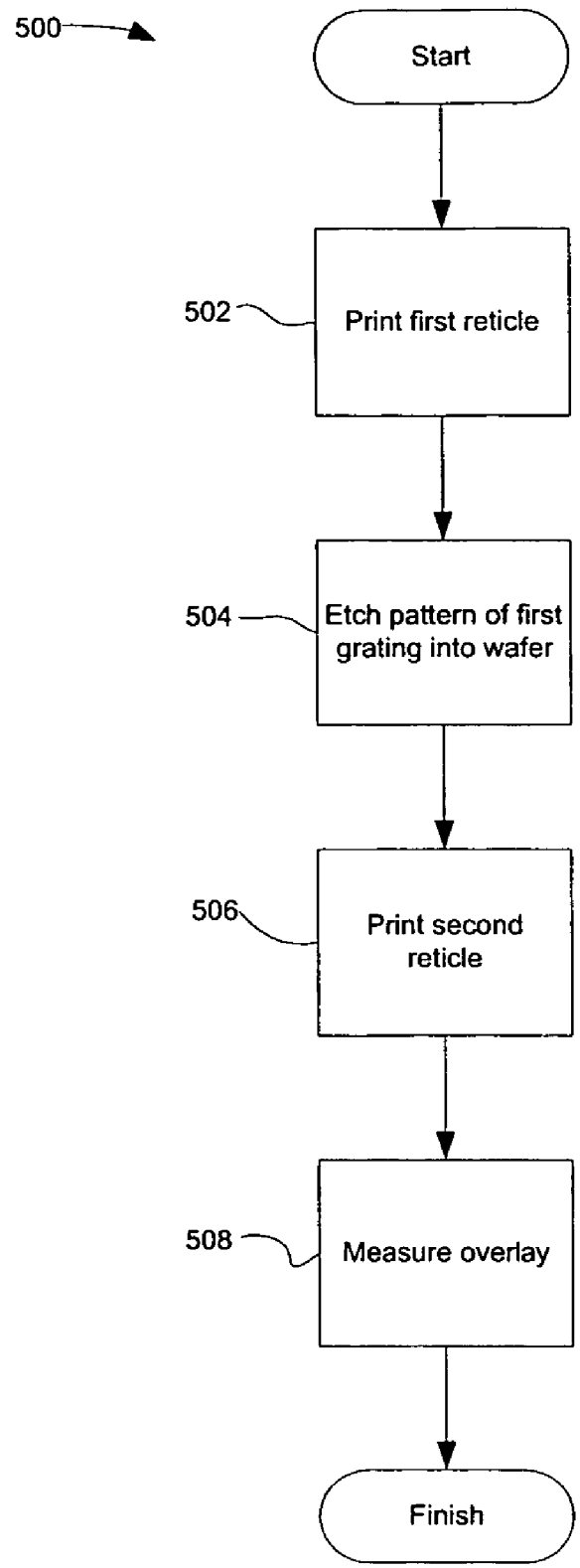
FIG. 5 is a flow chart describing a process for producing the interference pattern.

FIG. 5 is a flow chart describing a process for producing the interference pattern. In block 502, the first reticle is printed. The first reticle including the first grating 302 are printed on the wafer as resist lines. The pattern may be printed using photolithographic processes as described above. In block 504, the pattern of the first grating 302 is etched into the wafer. The pattern may be etched using any conventional etchant as is appropriate for the application.

In block 506, the second reticle is printed. When the second reticle is printed, the second grating 304 in the second reticle is printed so that the printed grating 304 at least partially overlaps the printed first grating 302. The two grating patterns are superimposed, producing an interference pattern. The first grating is pattern etched into the wafer, and the second grating is a series of resist lines.

In block 508, the overlay is measured. The observed overlay can be measured using microscopes including CCDs. For example, if a CCD had 80 nm pixels, and the pitches chosen resulted in an amplification of ten times, a 2 nm overlay would result in a shift in the peaks 412 of 20 nm. The 20 nm shift is equivalent to ¼ of a pixel of the CCD, which is much easier to detect than when using conventional alignment marks (where the same overlay would result in only produce a pixel shift of 1/40 of a pixel, since there is no amplification). The actual overlay can then be determined using the equations as described above.

Figure 6A:
FIGS. 6A, B, and C illustrate a technique for determining an overlay from an interference pattern.
Figure 6B:
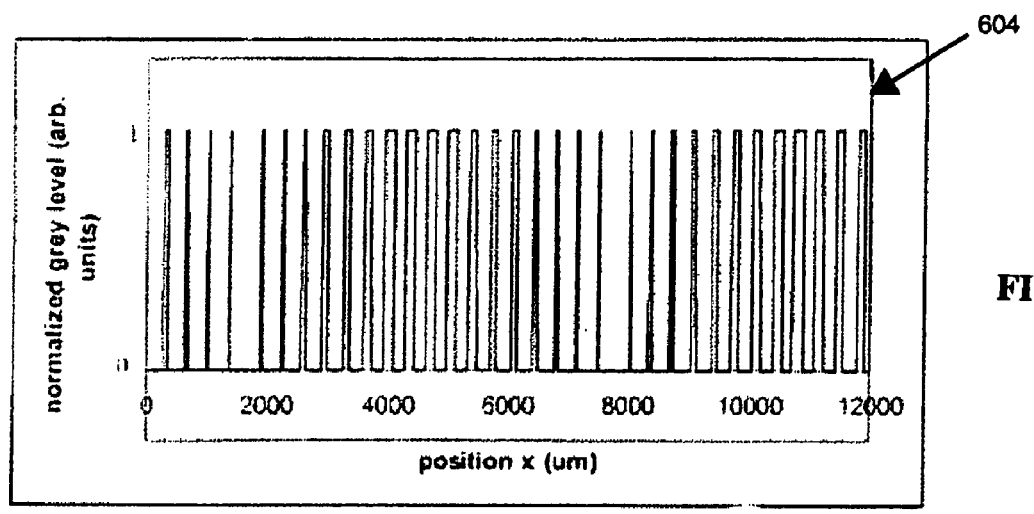
Figure 6C:
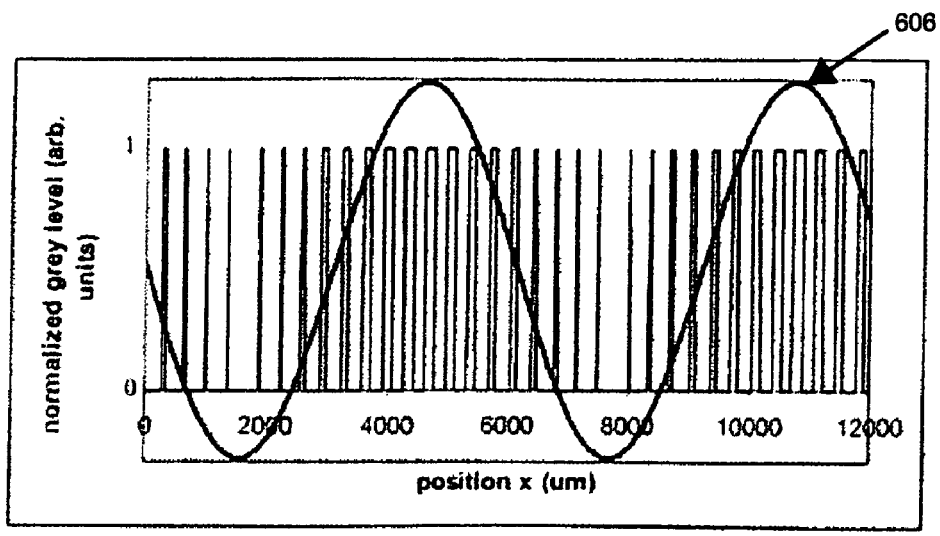

FIGS. 6A, B, and C illustrate a technique for determining an overlay from an interference pattern. FIG. 6A illustrates an interference pattern 602 that was produced using the method described above. FIG. 6B illustrates the interference pattern 602 reduced to a one-dimensional intensity profile 604, obtained by averaging the interference pattern 602 in the direction parallel to the grating openings. FIG. 6C illustrates a cosine graph 606 fitted to the one-dimensional intensity profile 604. The cosine graph 606 can be determined using the following equations. First, the period of the interference pattern, T, is determined using equation (5):

$$T = \frac{g_2}{\left(\frac{g_2}{g_1} - 1\right)} \quad (5)$$

The cosine graph 606 is defined by equation (6):

$$\cos\left(\frac{2\pi x}{T} + \phi\right) \quad (6)$$

where x is the distance in the direction of the measurement, and $\phi$ is the phase shift. Since the period T is determined using the pitches of the gratings, the fitting of the cosine graph is accomplished by varying $\phi$.

A shift in the interference pattern of one period must induce a $2\pi$ phase shift. As a result, the phase shift can be given by the following equation:

$$\phi = 2\pi\left(\frac{\Delta x}{T}\right) \quad (7)$$

The phase shift of the equation can be used to determine the overlay error. If equations (1) and (7) are substituted into equation (2), the following equation results:

$$\Delta x = g_2\left(\frac{\phi}{2\pi}\right) = \left(\frac{\phi}{2\pi}\right)\left(\frac{T}{A}\right) \quad (8)$$

The overlay error can be determined using equation (8). As can be seen, one needs only the pitch of the second grating, and the phase shift of the fitted cosine graph 606 to determine the overlay of two printed layers.

Figure 7:
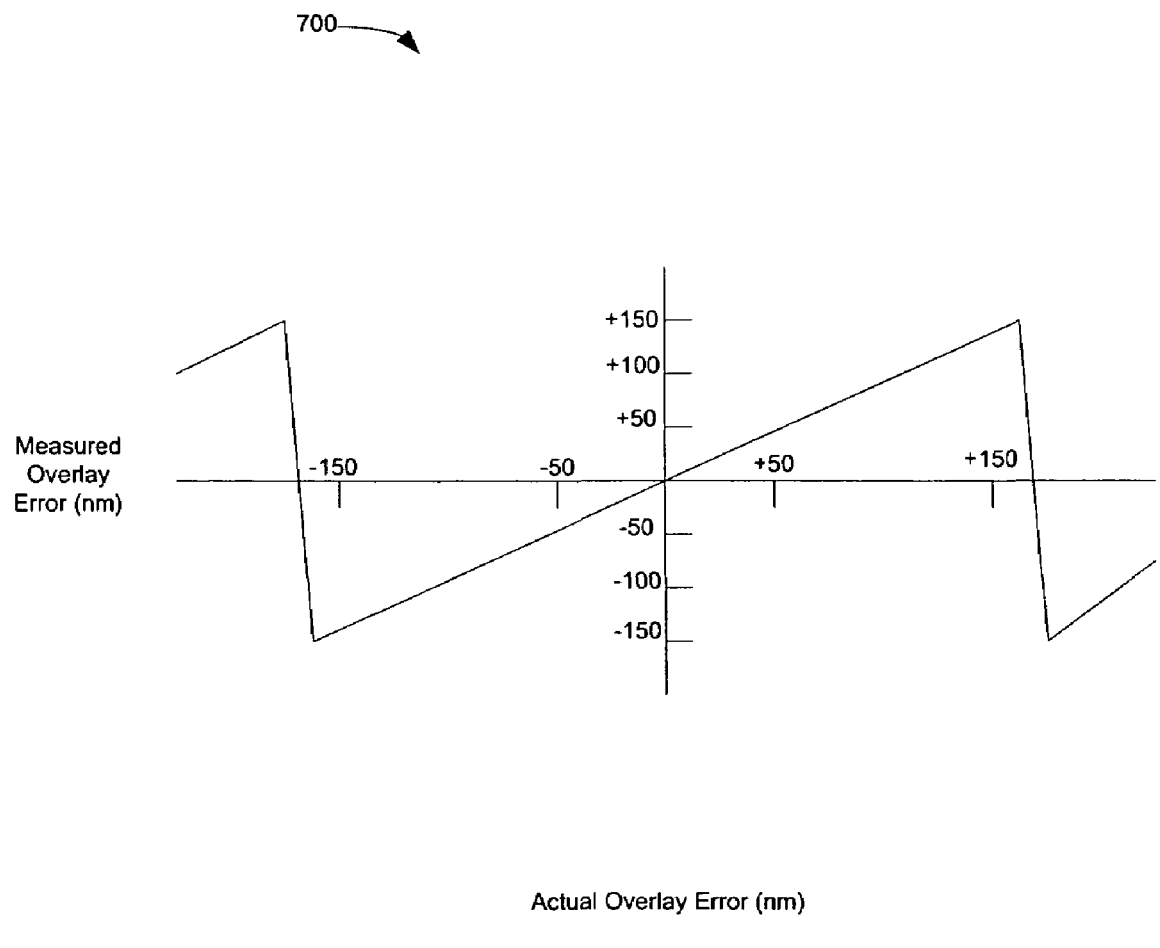
FIG. 7 illustrates a graph that shows the periodic nature of measured overlay errors.

The cosine graph 606 and the interference pattern 602 have a repeating period. As a result, the measured overlay error may correspond to more than one actual overlay error. FIG. 7 illustrates a graph 700 that shows the periodic nature of measured overlay errors. As shown in FIG. 7, using a first grating having a 300 nanometer pitch and a fifty percent duty cycle, and a second grating having a 320 nanometer pitch with a fifty percent duty cycle, an amplification of 15 times is achieved. As can be seen, the two gratings are capable of indicating an overlay error of plus or minus 150 nanometers. This range can be expanded or contracted by altering the grating measurements to change the amplification. For example, a process requiring less precision may need a larger window of possible overlay errors, and therefore less amplification. Conversely, a process requiring more precision may need a smaller window to improve the resolution, and therefore more amplification.

FIGS. 8A, B, C, and D illustrate an alternative embodiment of the invention using an alternate grating. The gratings shown in FIGS. 8A-8D may be used interchangeably with the gratings 302 and 304 described above. The techniques for determining the shift of the interference pattern are also applicable with this alternative embodiment.

FIG. 8A illustrates a grating 802 including an array of contacts. The grating 802 may be used in one of the reticles as described above. FIG. 8B illustrates a linear grating 804. The linear grating 804 may be used in the other reticle as described above. The grating 802 may be used when aligning a line/space layer to a contact layer, or vice-versa. This may be useful when measuring metal-to-contact/via overlay (and vice-versa).

Printing the two patterns 802 and 804 may produce the interference patterns 806 and 808 shown in FIGS. 8C and 8D. The interference pattern 806 results from the gratings being perfectly aligned (i.e., there is no overlay error). The interference pattern 808 results from the gratings 802 and 804 being misaligned by 2 pixels (e.g., 160 nm). The shift in the interference pattern can be measured using the same techniques described above. For example, a cosine graph can be fitted to the light and dark areas of the interference pattern 808, and the phase shift in the cosine pattern, combined with the pitch of the grating 804, can be used to calculate the actual overlay error.

The processes and techniques described regarding the current invention can be utilized using the same measurement devices currently available. Since the measured overlay error is amplified and much larger than previously available, the dependence on precision measurement devices is lessened.

This invention has been described with reference to specific exemplary embodiments thereof. It will, however, be evident to persons having the benefit of this disclosure that various modifications changes may be made to these embodiments without departing from the broader spirit and scope of the invention. The specification and drawings are accordingly to be regarded in an illustrative rather than in a restrictive sense.

The invention claimed is:

1. A method for measuring an overlay between a first reticle and a second reticle comprising:
    printing a first pattern of the first reticle onto a substrate;
    etching the first pattern into the substrate;
    printing a second pattern of the second reticle onto the substrate, wherein the second pattern partially overlaps the first pattern and the printing the second pattern generates an interference pattern on the substrate;
    generating a reference mark adjacent to the interference pattern, wherein generating the reference mark comprises:
        printing a third pattern of the first reticle onto the substrate, wherein the third pattern is adjacent to the first pattern;
        etching the third pattern into the substrate; and
        printing a fourth pattern of the second reticle onto the substrate, wherein the fourth pattern is adjacent to the second pattern, wherein the fourth pattern partially overlaps the third pattern to generate a second interference pattern; and
    measuring a shift in the interference pattern to determine the overlay, wherein measuring the shift in the interference pattern comprises comparing a first position of a first peak of the interference pattern to a second position of a second peak of the second interference pattern.

2. The method of claim 1, further comprising:
    generating the first pattern of the first reticle, wherein the first pattern is a first grating having a first pitch; and
    generating the second pattern of the second reticle, wherein the second pattern is a second grating having a second pitch different from the first pitch.

3. The method of claim 1, wherein printing the first and third patterns comprises printing resist lines, and wherein printing the second and fourth patterns comprises printing resist lines.

4. The method of claim 1, wherein the interference pattern is a Moire interference pattern.

5. The method of claim 2, wherein the first and second pitch are chosen to give an amplification of between five and twenty times.

6. A method for measuring an overlay between a first reticle and a second reticle comprising:
    printing a first pattern of the first reticle onto a substrate;
    etching the first pattern into the substrate;
    printing a second pattern of the second reticle onto the substrate, wherein the second pattern partially overlaps the first pattern and the printing the second pattern generates an interference pattern on the substrate;
    generating a reference mark adjacent to the interference pattern; and
    measuring a shift in the interference pattern to determine the overlay, wherein measuring the shift in the interference pattern comprises:
        fitting a cosine graph to the interference pattern;

determining a phase shift of the cosine graph; and
determining the overlay from the phase shift of the cosine graph.

7. The method of claim 1, wherein one of the interference pattern and the second interference pattern has a positive amplification, and wherein the other of the interference pattern and the second interference pattern has a negative amplification.

8. An apparatus for determining an overlay of photolithographically patterned layers comprising:
   a first grating of a first reticle having a first pitch;
   a second grating of a second reticle having a second pitch positioned such that when the first and the second reticles are used to pattern a substrate, a second image produced by printing the second grating onto the substrate partially overlaps a first image produced by printing the first grating onto the substrate followed by etching the first grating into the substrate, and the second image produces an interference pattern on the substrate that can be used to determine the overlay;
   a third reference mark grating on the first reticle adjacent to the first grating; and
   a fourth reference mark grating on the second reticle adjacent to the second grating, and wherein when the first and the second reticles are used to pattern the substrate, a fourth image produced by printing the fourth reference mark grating onto the substrate partially overlaps a third image produced by printing the third reference mark grating onto the substrate followed by etching the third reference mark grating onto the substrate, and the fourth image produces a second interference pattern that can generate a reference for the interference pattern,
   wherein one of the interference pattern and the second interference pattern has a positive amplification and wherein the other of the interference pattern and the second interference pattern has a negative amplification.

9. The apparatus of claim 8, wherein the first pitch and second pitch are chosen so that the interference pattern has an amplification of between five and twenty times.

10. The apparatus of claim 8, wherein the interference pattern is a Moire interference pattern.

11. The apparatus of claim 8, further comprising:
   a light source to expose the first and second reticles;
   a substrate including a layer of photoresist, wherein the first and second reticles are alternately placed in between the light source and the substrate.

12. The apparatus of claim 8, wherein a shift in the interference pattern is measured to determine the overlay.

13. The apparatus of claim 12, wherein the overlay error is measured using a microscope including a charge-coupled device (CCD).

14. The apparatus of claim 8, further comprising a first pattern on the first reticle to pattern a first layer on a substrate and a second pattern on the second reticle to pattern a second layer on the substrate.

15. An apparatus for determining an overlay of photolithographically patterned layers comprising:
   a substrate;
   a first reticle over the substrate including a first grating and a first reference mark grating adjacent to the first grating;
   a light source to project light onto the substrate through the first reticle to print the first grating on the substrate;
   a second reticle that may replace the first reticle over the substrate including a second grating and a second reference mark grating adjacent to the second grating such that when the second grating is printed at least partially over the first grating on the substrate an interference pattern is generated to measure an overlay error between the first and second reticle, and when the second reference mark grating is printed at least partially over the first reference mark grating on the substrate a second interference pattern is generated to measure a shift in the interference pattern; and
   a reference mark on at least one of the first or second reticles adjacent to either the first or second gratings.

16. The apparatus of claim 15, wherein the interference pattern is a Moiré interference pattern.

17. The apparatus of claim 15, wherein one of the interference pattern and the second interference pattern has a positive amplification, and wherein the other of the interference pattern and the second interference pattern has a negative amplification.

18. The apparatus of claim 15, wherein the overlay is determined by measuring a first phase shift of the interference pattern relative to a second phase shift of the second interference pattern.

* * * * *